United States Patent [19]

Koury, Jr. et al.

[11] Patent Number: 4,647,331

[45] Date of Patent: Mar. 3, 1987

[54] METHOD FOR ASSEMBLING AN ELECTRO-OPTICAL DEVICE

[75] Inventors: Daniel N. Koury, Jr.; Howard M. Berg, both of Scottsdale; David W. Stevenson, Mesa, all of Ariz.

[73] Assignee: Motorola, Inc., Schaumburg, Ill.

[21] Appl. No.: 653,490

[22] Filed: Sep. 24, 1984

Related U.S. Application Data

[63] Continuation of Ser. No. 518,578, Jul. 29, 1983, abandoned.

[51] Int. Cl.$^4$ .............................................. B32B 31/26
[52] U.S. Cl. ............................. 156/273.9; 156/275.5; 264/272.15; 350/96.15; 350/96.18; 317/72
[58] Field of Search .................. 29/569 L; 350/96.15, 350/96.18; 250/227; 357/30, 72; 156/273.9, 275.7, 275.5, 556; 264/272.15

[56] References Cited

U.S. PATENT DOCUMENTS

| 2,487,985 | 11/1949 | Ruben | 156/273.9 |
| 3,629,040 | 12/1971 | Hinton et al. | 156/273.9 |
| 4,054,473 | 10/1977 | Ohnstad | 156/273.9 |
| 4,225,213 | 9/1980 | McBride, Jr. et al. | 350/96.2 |
| 4,237,474 | 12/1980 | Ladany | 350/96.2 |
| 4,257,672 | 3/1981 | Balliet | 350/96.18 |
| 4,316,204 | 2/1982 | Inagaki et al. | 350/96.2 |

Primary Examiner—Donald Czaja
Assistant Examiner—Merrell C. Cashion
Attorney, Agent, or Firm—Joe E. Barbee; Paul F. Wille

[57] ABSTRACT

An assembly method is described in which low level light is used to align an optical fiber to the emitting area of an LED. When alignment is achieved, the power dissipated by the LED is increased to gel or partially cure an adhesive, thereby securing the aligned fiber to the LED.

8 Claims, 1 Drawing Figure

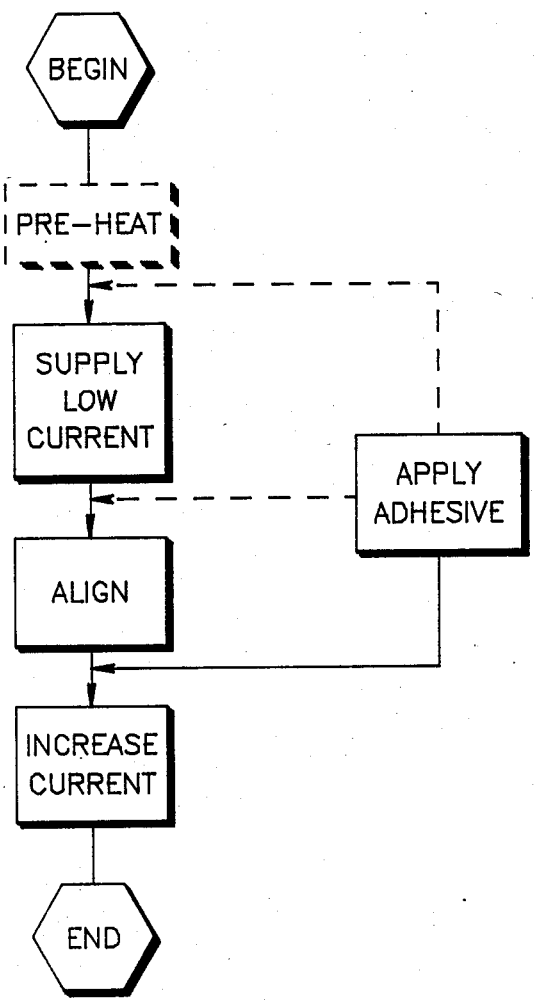

METHOD FOR ASSEMBLING AN ELECTRO-OPTICAL DEVICE

This application is a continuation of application Ser. No. 518,578 filed July 29, 1983 now abandoned.

This invention relates to the manufacture of semiconductor devices and, in particular, to the assembly of a segment of optical fiber and a light emitting semiconductor such that the fiber is optimally aligned over the light emitting area of the semiconductor.

Several techniques are presently known for aligning an optical fiber with a light emitting or light sensitive semiconductive device. One is a mechanical technique wherein a ring of material is concentric with the emitting or detecting area of the device. A lens, either alone or attached to the end of a fiber segment, seats itself on the ring thereby aligning itself with the photo-active area (either emitting or sensing light) of the semiconductor. A second method is to align the lens or fiber while the semiconductor emits light, thereby finding the optimal location by finding the maximum coupled light. The fiber and semiconductor are held in a jig while adhesive is applied and until the adhesive has cured. Typical adhesives are heat curable. Thus the jig must not only be precise but also must withstand repeated temperature cycling without becoming inaccurate.

For edge emitting light emitting diodes (LED's), i.e. lasers, and etched-well diodes, the alignment ring technique is not suitable. Even for surface emitting devices, where the ring enables mass production at low cost, the optimal alignment may not be obtained if the device does not emit uniformly over the active area. With the powered or visual alignment method, there is automatic compensation for non-uniform emission.

The problem is thus to find a method for powered alignment which obviates the handling and precision problems associated with jigging techniques.

In view of the foregoing, it is therefore an object of the present invention to provide an improved method for aligning powered LED's, semiconductor lasers, or etched well diodes.

Another object of the present invention is to provide an improved alignment of optical fibers or lenses with the photo-active area of opto-electronic semiconductor devices.

A further object of the present invention is to provide an improved method for assembling electro-optical semiconductor devices without the use of fixtures for maintaining alignment.

Another object of the present invention is to provide a method for assembling electro-optical devices using the device itself as a source of heat.

The foregoing objects are achieved in the present invention wherein low level current is passed through the electro-optical device. A fiber or lens is aligned with the photo-active area so that reasonably high light flux is obtained. Heat curable adhesive is applied to the volume between the fiber or lens and the semiconductor device, and the light flux is then maximized by optimizing alignment of the optical components. The current is then increased substantially to increase the heat generated in the device, thereby curing the adhesive in a short time.

A more complete understanding of the present invention can be obtained by considering the following detailed description in conjunction with the accompanying drawings, in which:

The single FIGURE illustrates the method of the present invention in a flow chart.

As illustrated in the FIGURE, the process in accordance with the present invention begins with the option of preheating the devices prior to aligning and attaching the optical fiber. Performing this step assures a uniform, predetermined temperature of the materials prior to the alignment and attachment steps. This is particularly desirable where different devices may have had dissimilar histories and enter the assembly operation of the present invention at different temperatures. For example, some die may have been stored for a length of time and are therefore cooler, whereas other die may still be warm from the preceding fabrication steps. While the particular temperature depends upon the thermal curing characteristics of the adhesive chosen, it has been found that maintaining the die at a temperature less than 100 degrees centigrade has produced acceptable results, with a temperature of approximately 75 degrees centigrade being preferred. The latter temperature permits typical adhesives to remain a liquid for sixty seconds or so.

The next step in the process is to supply a low level of current to the device. As can be appreciated by those skilled in the art, the level of current depends upon the type of device being assembled. Specifically, the level of current should be sufficient to activate the LED, but insufficient to generate appreciable amounts of heat in the die. For commonly used LED die, a current of 5-10 milliamperes has been found suitable. Depending upon the kind of device, other currents may be necessary to activate the device. Once activated, the alignment process can be carried out.

While the present invention is useful for the assembly of lensless as well as lensed electro-optical systems, it will be understood by those of skill in the art that the benefits of the present invention are greater with lensed optical systems. For example, a lens attached to the end of an optical fiber increases the luminous flux transmitted through the fiber by improving the light gathering ability of the end of the optical fiber but also increases the sensitivity to misalignment. As used herein, optical fiber means is intended to refer to an optical fiber with or without a lens attached to the end thereof. When the semiconductor device is activated, the optical fiber means is brought into proximity with the active area. The amount of light coupled into the optical means is monitored and the optical fiber means is moved about until a maximum flux is obtained. Particularly for optical fibers having lenses, it is desirable to align the end of the optical fiber means in all three dimensions, or directions of motion, with respect to the active area of the semiconductor device. Suitable x-y manipulators having a stage moveable in the the z direction relative to the chuck holding the optical fiber means exist in the prior art.

As illustrated in the figure, at some point in the process thus far a quantity of adhesive is applied to the volume between the end of the optical fiber means and the semiconductor device. Depending upon the type of adhesive chosen it may be desirable to apply the adhesive either as the first step or just prior to the alignment step. In a preferred embodiment of the present invention, the adhesive is applied after the approximate alignment has been accomplished and prior to the curing of the adhesive. Any suitable adhesive known in the art for use in electro-optical devices may be used in accordance with the present invention provided they are heat cured. One adhesive found suitable is a silicone material available from General Electric Company and sold under the tradename GE-261. Other adhesives may also be used. Although the application of the adhesive after the alignment should not upset the alignment, because such adhesives are typically of very low viscosity, it will sometimes affect the optics so as to require a small re-alignment to achieve optimum coupling. If such should be the case, one may apply the adhesive at an early point in the process thereby obviating any problem of misalignment caused by the application of the adhesive or the index of refraction of the adhesive. The adhesive is typically applied through hollow needles disposed about the active area of the semiconductor device.

After the optical fiber means is aligned with the active area, the current through the device is pulsed ie. increased to a predetermined value, thereby substantially increasing the heat dissipated in the device. The heat dissipated by the device causes its temperature to rise thereby curing the adhesive. For example, increasing the current through the LED to 100-125 milliamperes rapidly heats the small volume of silicone adhesive whereby a partial cure or gel is effected within about five seconds. By way of comparison, if the adhesive is kept at a temperature below but near a temperature of 100 degrees centigrade, the time for a gel to form is approximately two minutes. This step is most efficient with small emission diameter LEDs since the heating effect is more concentrated. Fortunately, these devices require higher accuracy alignment which is assured by the short gelling time achievable with these devices. An advantage to having the semiconductor devices enter the process at a uniform temperature is that the pulse of current used to effect a cure is then uniform and need not be adjusted to the incoming temperature of the semiconductor devices. A higher workpiece temperature also decreases the current pulse required.

After the pulse of current is applied and the adhesive gels, the electro-optical device can be removed from the fixture and restored to a batch process for complete curing of the adhesive.

There is thus provided by the present invention an improved method for assembling opto-electronic devices wherein the coupling from the active area of the semiconductor into the optical fiber is improved. For example, using the mechanical ring with light emitting diodes having emission diameters of 50 microns and 75 microns the method of the present invention, on the average, yielded ten percent higher coupling efficiencies for the larger emission diameter and closer to twenty percent increased coupling efficiency using devices having the smaller emission diameter.

Having thus described the invention it will be apparent to those of skill in the art that various modifications can be made within the spirit and scope of the present invention. As previously noted, the adhesive may be applied at various stages depending upon the type of adhesive. In addition to the GE-261 silicone die coating, other suitable adhesives are DC-6101 or DC-6103. Further, while it is preferred that the alignment be carried in three axes or directions of motion, such may be carried out in two directions, eg. x and y, depending upon the emission diameter and the diameter of the fiber. While described in a preferred embodiment being used in the assembly of light emitting devices, the advantages of the present invention are equally well obtainable with light sensing devices by shining light from the fiber onto the detector. The device is then caused to dissipate increased power to gel the adhesive.

We claim:

1. A process for assembling opto-electronic devices comprising the steps of
   supplying electric current to a semiconductor die, said current being sufficient to activate said semiconductor die but insufficient to substantially warm said semiconductor die;
   aligning optical fiber means with respect to an active area on said semiconductor die;
   applying adhesive to the volume between said fiber and said semiconductor die either before, between, or after said supplying and aligning steps; and then
   increasing said current to warm said semiconductor die and at least partially curing said adhesive, thereby securing the alignment of said optical fiber means to said semiconductor die.

2. The process as set forth in claim 1 wherein said fiber means is aligned in three axes of motion.

3. The process as set forth in claim 1 wherein said semiconductor die comprises a light emitting diode and said current is sufficient to cause said diode to emit light but is insufficient to cause appreciable heating of the diode.

4. The process as set forth in claims 1 or 3 and further comprising the initial step of heating said semiconductor die to a predetermined temperature.

5. The process as set forth in claim 4 wherein said fiber means is aligned in at least two axes of motion.

6. The process as set forth in claim 5 wherein said optical fiber means comprises an optical fiber having a lens on the end thereof adjacent said semiconductor die and wherein said alignment step comprises adjusting the spacing of the lens from said semiconductor die.

7. The process as set forth in claim 6 wherein said fiber means is aligned in three axes of motion.

8. A method for assembling an optical fiber to an optoelectronic semiconductor die, comprising: activating the optoelectronic semiconductor die at a power level to operation of the die but to not cause the die to generate an a substantial amount of heat; aligning the optical fiber and the die; applying adhesive to the optical fiber and the die; and activating the optoelectronic semiconductor die at a high power level so that heat generated by the die will cure the adhesive thereby bonding the optical fiber to the die.

* * * * *

UNITED STATES PATENT AND TRADEMARK OFFICE
CERTIFICATE OF CORRECTION

PATENT NO. : 4,647,331

DATED : March 3, 1987

INVENTOR(S) : Daniel N. Koury et al.

It is certified that error appears in the above-identified patent and that said Letters Patent is hereby corrected as shown below:

Claim 8, line 50, before the word "power" insert -- low --.

Claim 8, line 51, before the word "operation" insert -- provide --.

Claim 8, line 52, before the word "a" delete "an".

Signed and Sealed this

Twenty-fourth Day of November, 1987

Attest:

DONALD J. QUIGG

*Attesting Officer*  *Commissioner of Patents and Trademarks*